(12) United States Patent
Roine

(10) Patent No.: US 7,215,201 B2
(45) Date of Patent: May 8, 2007

(54) INTEGRATED CIRCUIT HAVING A LOW POWER, GAIN-ENHANCED, LOW NOISE AMPLIFYING CIRCUIT

(75) Inventor: Per Torstein Roine, Oslo (NO)

(73) Assignee: Texas Instruments Norway AS, Oslo (NO)

( * ) Notice: Subject to any disclaimer, the term of this patent is extended or adjusted under 35 U.S.C. 154(b) by 116 days.

(21) Appl. No.: 11/156,851

(22) Filed: Jun. 20, 2005

(65) Prior Publication Data

US 2006/0284679 A1 Dec. 21, 2006

(51) Int. Cl.
*H03F 3/26* (2006.01)
(52) U.S. Cl. ..................... 330/269; 330/255
(58) Field of Classification Search ............... 330/269, 330/262, 255, 253
See application file for complete search history.

(56) References Cited

U.S. PATENT DOCUMENTS

| | | | |
|---|---|---|---|
| 5,721,500 A | | 2/1998 | Karanicolas |
| 6,317,000 B1 * | | 11/2001 | Ivanov et al. ............... 330/255 |
| 6,384,683 B1 * | | 5/2002 | Lin ............................. 330/257 |
| 6,556,085 B2 | | 4/2003 | Kwon et al. |
| 6,714,076 B1 * | | 3/2004 | Kalb .......................... 330/255 |

* cited by examiner

*Primary Examiner*—Henry Choe
(74) *Attorney, Agent, or Firm*—John J. Oskorep, Esq.

(57) ABSTRACT

An amplifying circuit includes an n-type transistor having a source, a gate coupled to a first bias voltage, and a drain coupled to a first supply voltage through a first impedance circuit. A p-type transistor of the circuit has a source coupled to the source of the n-type transistor, a gate coupled to a second bias voltage, and a drain coupled to a second supply voltage through a second impedance circuit. A first differential input is coupled to the gate of the n-type transistor through a first capacitor and to the gate of the p-type transistor through a second capacitor. A second differential input is coupled to the sources of the n-type and the p-type transistors. A third capacitor has a first end coupled to the drain of the n-type transistor, and a fourth capacitor has a first end coupled to the drain of the p-type transistor and a second end coupled to a second end of the third capacitor. An output of the amplifier circuit is provided at the second ends of the third and the fourth capacitors. The n-type transistor and the first impedance circuit serve as a common-source amplifier for a signal at the first differential input and as a common-gate amplifier for the signal at the second differential input. Similarly, the p-type transistor and the second impedance circuit serve as a common-source amplifier for the signal at the first differential input and as a common-gate amplifier for the signal at the second differential input.

27 Claims, 4 Drawing Sheets

INTEGRATED CIRCUIT HAVING A LOW POWER, GAIN-ENHANCED, LOW NOISE AMPLIFYING CIRCUIT

BACKGROUND

1. Field of the Technology

The present application relates generally to the fields of electronic circuits, microelectronics, and radio frequency (RF) integrated circuit (IC) design, and more particularly to a low noise amplifier (LNA) which provides high signal gain with low power consumption by sharing a bias current among active devices of the LNA.

2. Description of the Related Art

A fundamental challenge in the design of a low noise amplifier (LNA) in an integrated circuit (IC) with a relatively small current consumption is to achieve a sufficient transconductance of the active devices for determining its gain and noise performance. The trade-offs between the signal gain, the noise figure, and the bias current are especially difficult with Complementary Metal-Oxide Semiconductor (CMOS) LNAs due to the inherent low transconductance of Metal-Oxide Semiconductor Field Effect Transistors (MOSFETs). For a constant current draw, the performance of high frequency LNAs can be improved by resonant load peaking using on-chip or external inductors. This approach, however, is not the most cost-effective due to the silicon area penalty or increased bill-of-material. In highly-integrated radio frequency (RF) communication transceivers, fully differential circuit topologies and signals are generally advantageous with respect to noise immunity, suppression of troublesome second-order spurious responses, and the grounding reference of sensitive RF modules. The performance advantages of differential RF circuits are, in most cases, a trade-off with the resulting increase in power consumption and larger die size. In cost-effective RF transceivers, package pins and external coupling networks are often shared by the receiver LNA input and the transmitter power amplifier output ports. In such transceivers, another desirable characteristic for a robust, low voltage, and low power amplifier design is a reasonably low and well-controlled impedance from the standpoint of the LNA input(s). As apparent, compact and robust differential LNA designs with high performance at low power consumption are highly desirable.

An established technique to achieve lower power amplification is "current reuse," where a direct current (DC) bias current is recycled through several active devices. For example, U.S. Pat. No. 5,721,500 to Karanicolas describes a current reuse technique which effectively doubles the transconductance of a single stage of the amplifier without increasing the bias current. The transistors M1 and M2 of the '500 patent are utilized to essentially form a digital inverter which is biased for a large gain by the negative feedback loop. The key to the design in the '500 patent is that, given the same bias current, the effective transconductance of the amplifier is $(g_{m1}+g_{m2})$, as opposed to simply $g_{m1}$ in the case that transistor M2 were omitted. This circuit has some drawbacks, such as high input and output impedances which require external matching networks in order to match to well-accepted impedance levels (e.g. 50 ohms). The high impedance nodes also make the circuit sensitive to capacitive parasitics. The circuit also requires a DC feedback network to define the operating points of the transistors. Finally, the design is inherently a single-ended circuit topology which is not always optimal from the standpoint of noise immunity in highly integrated designs.

Single-ended LNA topologies which provide current-reuse to achieve high transconductance are described in the prior art. One common drawback of these circuits is the large number of inductors required for impedance matching and signal transfer purposes. The use of such inductors results in either a prohibitively large silicon area for IC design or a large number of external components. For example, in U.S. Pat. No. 6,556,085 to Ick Jin Kwon et al., several single-ended LNA topologies employ current-reuse to achieve high transconductance. The open literature also teaches designs which utilize current-reuse cascading techniques, such as "A 5.7 GHz 0.18 μm CMOS Gain-Controlled Differential LNA With Current Reuse for WLAN Receiver," Che-Hong Liao and Huey-Ru Chuang, IEEE Microwave and Wireless Component Letters, Vol. 13, No. 12, December 2003; "A 22-mW 435-MHz Differential CMOS High-Gain LNA For Subsampling Receivers," Te-Hsin D. Huang et al., IEEE International Symposium on Circuits and Systems (ISCAs) 2002; and "Design of a 5.7 GHz 0.18 μm CMOS Current-Reused LNA For An 802.11A WLAN Receiver," Liang-Hui Li and Huey-Ru Chuang, National Cheung Kung University, Taiwan, Microwave Journal, February 2004. The feedback, common-gate hybrid differential LNA circuit topology used by the Berkeley Wireless Research Center (USA) and presented by Stanley Wang in "RF Circuits & Antennas for <1 GHz UWB" on Jun. 12 2003, also employs a current-reuse technique and signal coupling scheme. In particular, the LNA presented by Stanley Wang combines shunt-series feedback and common-gate amplifier topologies by stacking a p-channel MOSFET (PMOS transistor) on top of an n-channel MOSFET (NMOS transistor). Still, however, better noise performance and higher design flexibility for an LNA may be achieved.

SUMMARY

An integrated circuit (IC) having a low power, gain-enhanced, low noise amplifying circuit is described herein. In general, the amplifying circuit has an n-type transistor which is "stacked" on top of a p-type transistor. In one illustrative embodiment, the n-type transistor has a source, a gate coupled to a first bias voltage, and a drain coupled to a first supply rail voltage through a first impedance circuit. The p-type transistor has a source coupled to the source of the n-type transistor, a gate coupled to a second bias voltage, and a drain coupled to a second supply rail voltage through a second impedance circuit. A first differential input is coupled to the gate of the n-type transistor through a first capacitor and to the gate of the p-type transistor through a second capacitor. A second differential input is coupled to the sources of the n-type and the p-type transistors. A third capacitor has a first end coupled to the drain of the n-type transistor, and a fourth capacitor has a first end coupled to the drain of the p-type transistor and a second end coupled to a second end of the third capacitor. An output of the amplifier circuit is provided at the second ends of the third and the fourth capacitors. The n-type transistor and the first impedance circuit serve as a common-source amplifier for a signal at the first differential input and as a common-gate amplifier for the signal at the second differential input. Similarly, the p-type transistor and the second impedance circuit serve as a common-source amplifier for the signal at the first differential input and as a common-gate amplifier for the signal at the second differential input.

In another illustrative embodiment, a differential amplifier of the IC includes a first n-type transistor which is "stacked" on top of a first p-type transistor and a second n-type transistor which is "stacked" on top of a second p-type transistor. The first n-type transistor has a source, a gate coupled to a first bias voltage, and a drain coupled to a first supply rail voltage through a first impedance circuit. The first p-type transistor has a source coupled to the source of the first n-type transistor, a gate coupled to a second bias voltage, and a drain coupled to a second supply rail voltage through a second impedance circuit. A first differential input is coupled to the gate of the first n-type transistor through a first capacitor and to the gate of the first p-type transistor through a second capacitor. A second differential input is coupled to the sources of the first n-type and the first p-type transistors. A third capacitor has a first end coupled to the drain of the first n-type transistor, and a fourth capacitor has a first end coupled to the drain of the first p-type transistor and a second end coupled to a second end of the third capacitor. The second n-type transistor has a source, a gate coupled to the first bias voltage, and a drain coupled to the first supply rail voltage through a third impedance circuit. The second p-type transistor has a source coupled to the source of the second n-type transistor, a gate coupled to the second bias voltage, and a drain coupled to the second supply rail voltage through a fourth impedance circuit. The first differential input is coupled to the sources of the second n-type and the second p-type transistors. The second differential input is coupled to the gate of the second n-type transistor through a fifth capacitor and to the gate of the second p-type transistor through a sixth capacitor. A seventh capacitor has a first end coupled to the drain of the second n-type transistor, and an eighth capacitor having a first end coupled to the drain of the second p-type transistor and a second end coupled to a second end of the seventh capacitor. A first differential output is provided at the second ends of the third and the fourth capacitors, and a second differential output is provided at the second ends of the seventh and the eighth capacitors.

BRIEF DESCRIPTION OF THE DRAWINGS

The invention may best be understood by reference to the following description, taken in conjunction with the accompanying drawings, in the several figures of which like reference numerals identify like elements, and in which.

DETAILED DESCRIPTION OF PREFERRED EMBODIMENTS

While the claims recite the specific features of the inventive devices of the present application, it is believed that the present invention will be better understood from a consideration of the following description accompanied with the figures.

As will be described in detail below, an amplifying circuit of the present application provides high performance, impedance controllability, robustness, and low power. The amplifying circuit achieves high performance by combining the functional advantages of field-effect transistors (FETs) in common-source and common-gate configurations, and employs bias current reuse for power optimization. A differential signal arrangement, together with a stacking scheme of the active devices, enable each of the active devices to function as a common-source, common-gate hybrid amplifier. Alternatively, bipolar junction transistor (BJT) implementations utilize a common-emitter and common-base configuration to achieve the same advantages of the FET topology which employs the common-source and common-gate configurations. The amplifying circuit of the present application also has an improved noise performance. Simple signal connections between the components allow the bias current to be shared be the active devices. The amplifying circuit is robust with respect to implementation and needs only a small silicon area due to its low complexity.

Figure 1:
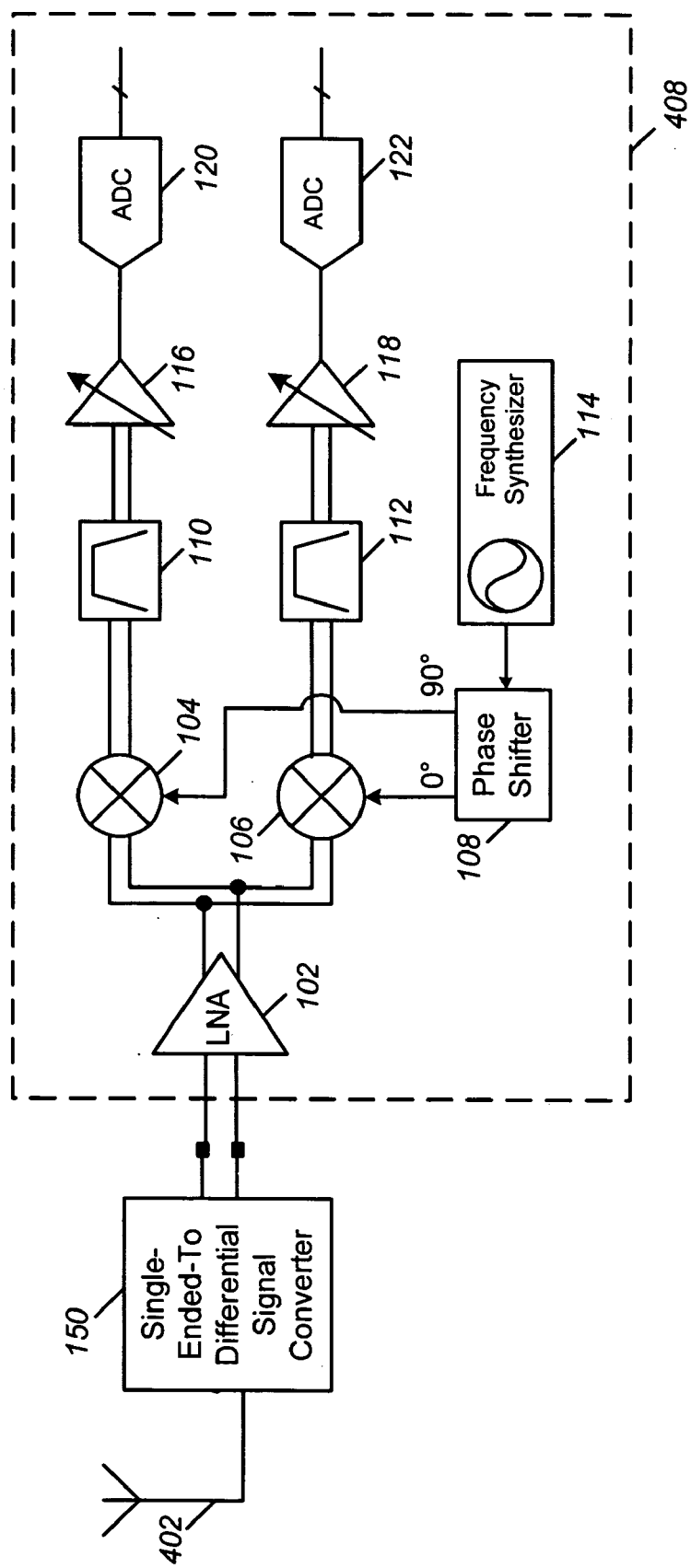
FIG. 1 is a schematic block diagram of a wireless receiver having a low-noise amplifier (LNA) which may be embodied in an integrated circuit (IC)

FIG. 1 is a block diagram of a receiver 408 within which the circuits of the present application may be incorporated. Receiver 408 includes a low noise amplifier (LNA) 102, mixers 104 and 106, a frequency generation unit (FGU) 114, a phase shifter 108, bandpass filters (BPFs) 110 and 112, variable amplifiers 116 and 118, and analog-to-digital converters (ADCs) 120 and 122. LNA 102 is the pertinent focus of the present application. LNA 102 has a differential input which is coupled to a differential output of a single-ended-to-differential converter 150, which is coupled to an antenna 402. Single-ended-to-differential converter 150 may be or include an RF balun or other suitable circuit which is adapted to convert a radio frequency (RF) signal from antenna 408 into a differential signal. This RF signal from converter 150 has a frequency in a range between about 100 MHz and 2.4 GHz, and has a very low signal strength which is in the microvolt (µV) range. Note that any differential signal has two signal components: a first signal component and a second signal component which is 180° out-of-phase with the first signal component. The received differential signal is applied at the differential input of LNA 102. LNA 102 has a differential output which provides an amplified differential signal which is substantially the same as the received differential signal, except that it is amplified with a gain G of LNA 102. A typical gain G for LNA 102 may be about 30 dB, which would provide a differential output signal in the 32 µV range for a 1 µV input.

The differential output from LNA 102 is coupled to mixers 104 and 106. An output of FGU 114 is coupled to phase shifter 108, which has a 90°-shifted signal output coupled to mixer 104 and a 0°-shifted signal output coupled to mixer 106. A differential output of mixer 104 (I-channel) is coupled to BPF 110, whose differential output is coupled to variable amplifier 116, whose single-ended output is coupled to ADC 120. A differential output of mixer 106 (Q-channel) is coupled to BPF 112, whose differential output is coupled to variable amplifier 118, whose output is coupled to ADC 122.

Figure 4:
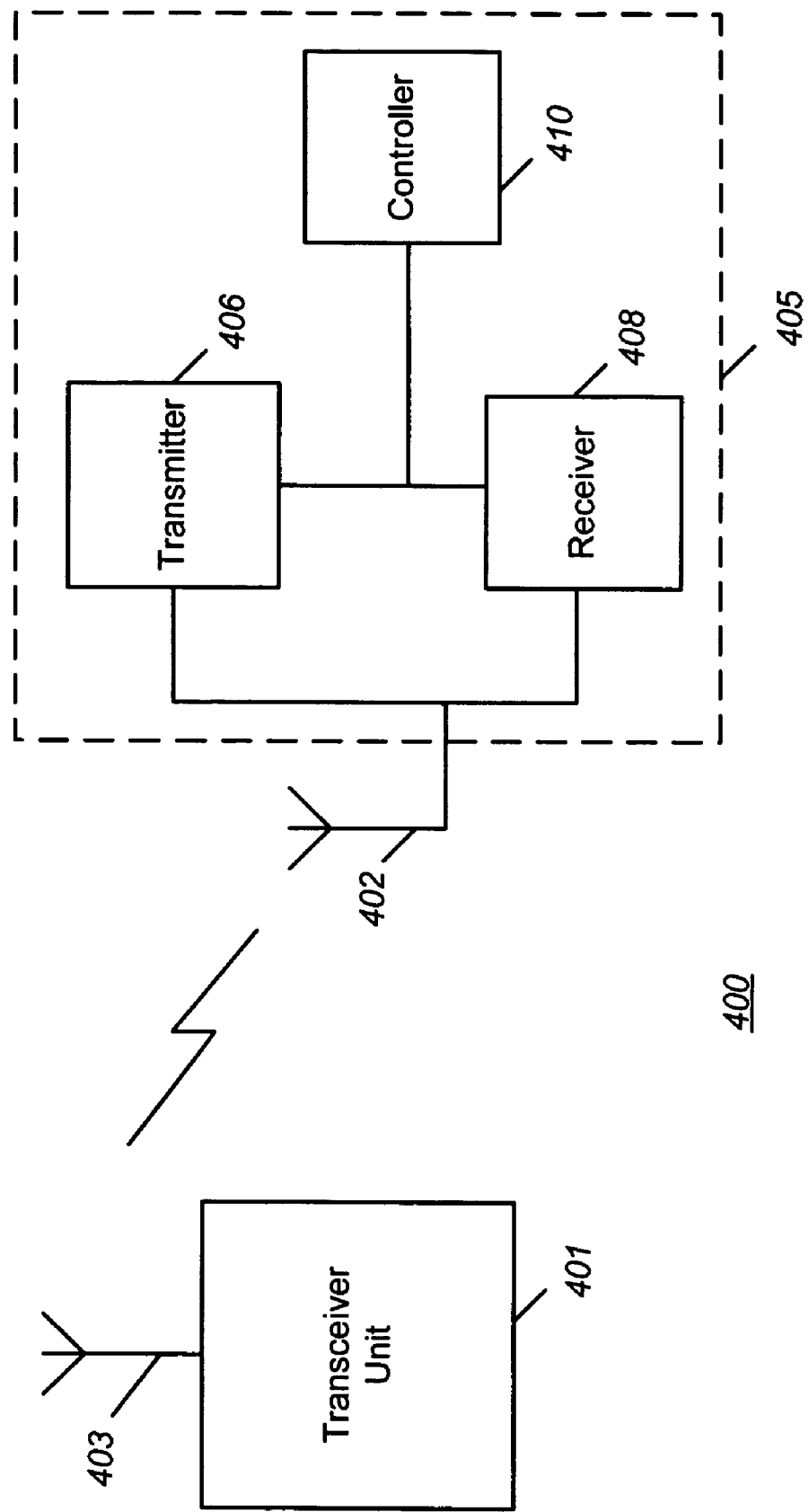
FIG. 4 is a simplified illustration of a communication system and radio frequency (RF) transceiver within which the IC of the present application may be utilized.

Referring ahead to FIG. 4, an illustration of a wireless or RF communication system 400 within which receiver 408 having the LNA of the present application may be utilized. Communication system 400 includes a first transceiver unit 401 and a second transceiver unit 405. As shown, second transceiver unit 405 includes a transmitter 406, a controller 410, and receiver 408, which includes the LNA of the present application. Typically, controller 410 is or includes a microcontroller or microprocessor which is programmed with software to control the operations of transmitter 406 and receiver 408. Antenna 402 of second transceiver unit 405 is coupled to transmitter 406 and receiver 408. First transceiver unit 401 may be constructed similarly as second transceiver unit 405, and has an antenna 403 which is utilized to communicate wireless RF signals to and from second transceiver unit 405.

Figure 2:
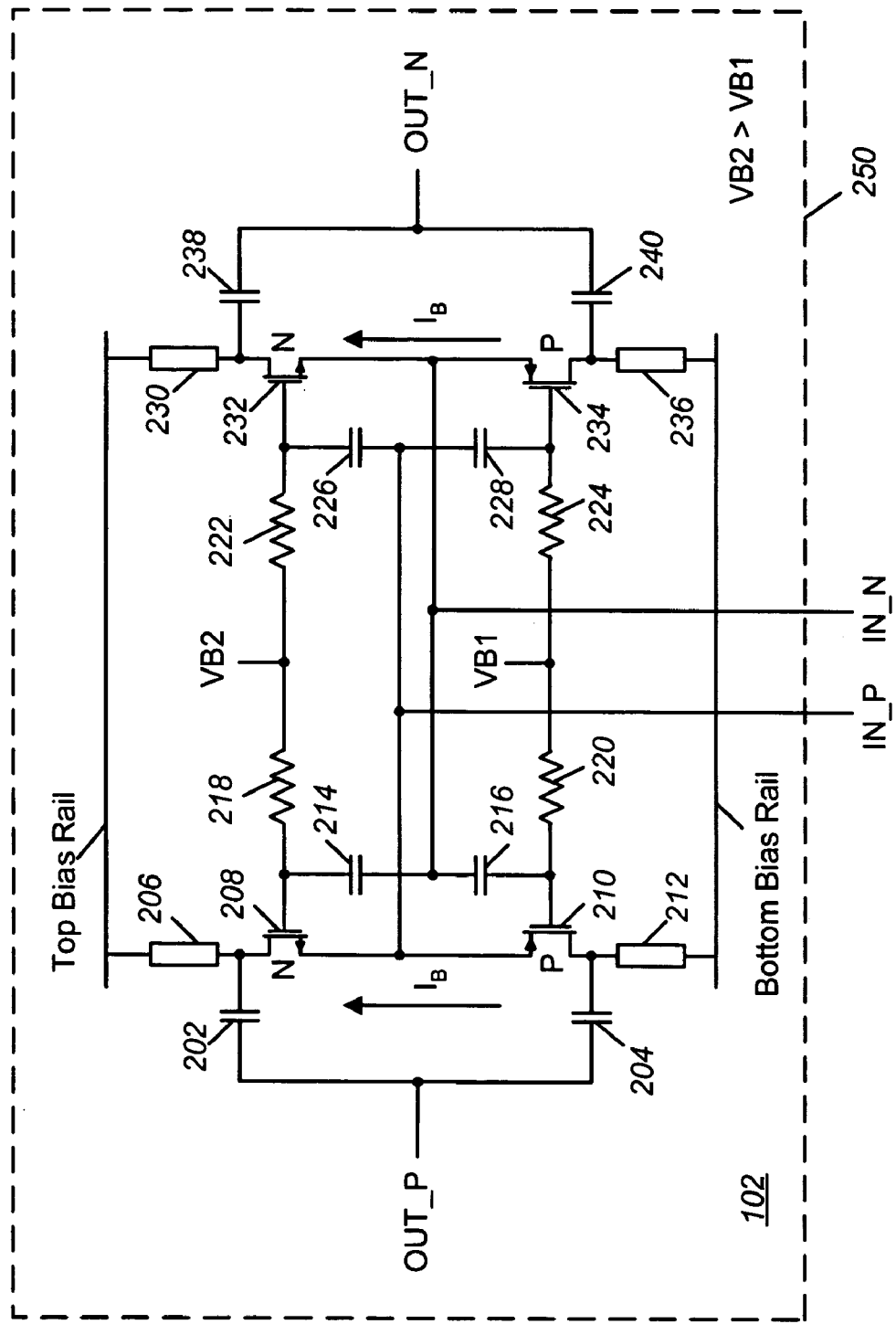
FIG. 2 is a schematic diagram of a low noise amplifier of the present application in a first embodiment, where the amplifier has a full differential transfer (i.e. a full differential input and a full differential output)

Referring now to FIG. 2, a schematic diagram of a first embodiment of a low power, gain-enhanced, low noise amplifying (LNA) circuit 102 of the present application is shown. In FIG. 2, amplifying circuit 102 is a full differential amplifier (i.e. both the input signal and the output signal are fully differential) which may be used as LNA 102 of FIG. 1. Amplifying circuit 102 is preferably embodied in an integrated circuit (IC) 250.

A differential input signal is presented at the differential input of LNA 102 which is represented by IN_N and IN_P nodes. The differential input (i.e. the IN_N and IN_P nodes) is provided at and exposed externally on IC 250 in the form of conductive pads or leads. As shown in FIG. 2, the IN_N node is coupled to first ends of capacitors 214 and 216, a source of a negative-channel (n-channel) transistor 232, and a source of a positive-channel (p-channel) transistor 234. Preferably, n-channel transistor 232 is an N-channel Metal Oxide Semiconductor Field Effect Transistor (MOSFET) (or NMOS transistor) and p-channel transistor 234 a P-channel MOSFET (or PMOS transistor). The IN_P node is coupled to first ends of capacitors 226 and 228, a source on an n-channel transistor 208, and a source on a p-channel transistor 210. Preferably, n-channel transistor 208 is an N-channel MOSFET (or NMOS transistor) and p-channel transistor 210 is a P-channel MOSFET (or PMOS transistor). A second end of capacitor 214 is coupled to a gate of n-channel transistor 208 and a second end of capacitor 216 is coupled to a gate of p-channel transistor 210. Similarly, a second end of capacitors 226 is coupled to a gate of n-channel transistor 232 and a second send of capacitor 228 is coupled to a gate of p-channel transistor 234. As described earlier, an RF signal applied at the differential input of LNA 102 has a frequency range between 100 MHz and 2.4 GHz, and has a very low signal strength in the µV range. An output node OUT_N is coupled to first ends of capacitors 238 and 240, which have second ends which are coupled to drains of transistors 232 and 234, respectively. Similarly, an output node OUT_P is coupled to first ends of capacitors 202 and 204, which have second ends which are coupled to drains of transistors 208 and 210, respectively.

A top bias rail voltage (e.g. 1.8 volts) is coupled to first ends of impedance circuits 206 and 230, which have second ends which are coupled to the drains of transistors 208 and 232, respectively. A bottom bias rail voltage (e.g. 0 volts) is coupled to first ends of impedance circuits 212 and 236, which have second ends which are coupled to the drains of transistors 210 and 234, respectively. Although any suitable bias rail voltages may be utilized, the top bias rail voltage is generally greater than the bottom bias rail voltage. A bias voltage VB1 is coupled to first ends of resistors 220 and 224, which have second ends coupled to the gates of n-channel transistors 210 and 234, respectively. The second ends of resistors 220 and 224 are also coupled to the second ends of capacitors 216 and 228, respectively. A bias voltage VB2 is coupled to first ends of resistors 218 and 222, which have second ends coupled to the gates of p-channel transistors 208 and 232. The second ends of resistors 218 and 222 are also coupled to the second ends of capacitors 214 and 226, respectively. Although any suitable bias voltages VB1 and VB2 may be utilized, VB2 is generally greater than VB1. A bias current $I_B$ controlled by the bias voltages VB1 and VB2 may be set to as low as a few hundred microamperes, and in the present embodiment is set to 1 mA. Note that resistors 218, 220, 222, and 224 are optional depending on the specific circuit design. In a variation to that shown and described in relation to FIG. 2, each pair of n-channel transistors 208 and 232 and p-channel transistors 210 and 234 may additionally be "back-gate coupled".

Impedance devices 206, 212, 230, and 236 may be referred to as "loads" and be implemented using any suitable components. Preferably, amplifying circuit 102 is devoid of any inductors where each impedance circuit 206, 212, 230, and 236 is implemented simply as a resistor. In this case, only a relatively small silicon area is needed for amplifying circuit 102 within the IC. Alternatively, the impedance circuits 206, 212, 230, and 236 may be implemented as inductors, capacitors, resistors, transformers, or any combination thereof.

Together, the coupling of transistors 208, 210, 232 and 234, impedance circuits 206, 212, 230 and 236 with capacitors 202, 204, 214 and 216 form a differential hybrid common-gate and common-source amplifying unit with current reuse. The circuit configuration of n-channel transistor 208 and impedance circuit 206 serves as both an NMOS common-gate amplifier to the input signal IN_P and as an NMOS common-source amplifier to the input signal IN_N. The circuit configuration of p-channel transistor 210 and impedance circuit 212 serves as both a PMOS common-gate amplifier to the input signal IN_P and as a PMOS common-source amplifier to the input signal IN_N. Similarly, the circuit configuration of n-channel transistor 232 and impedance circuit 230 serves as a NMOS common-gate amplifier to the input signal IN_N and as a NMOS common-source amplifier to the input signal IN_P. The circuit configuration of p-channel transistor 234 and impedance circuit 236 serves as a PMOS common-gate amplifier to the input signal IN_N and as a PMOS common-source amplifier to the input signal IN_P. A typical gain G for LNA 102 of FIG. 2 may be on the order of about 30 dB, which would provide a differential output signal in the 32 µV range, given a bias signal of about 1 mA and an RF input level of 1 µV.

As apparent, the amplifying circuit of the present application employs an NMOS transistor which is "stacked" on top of a PMOS transistor where both transistors serve as amplifying devices to a differential input signal. High gain is achieved at low power consumption by effective utilization of the differential input signal, combining the outputs of the amplifiers, and reusing DC bias current. A NMOS device stacked on top of a PMOS increases the equivalent transconductance $G_m$ of the circuit from $g_{mn}$ or $g_{mp}$ to $(g_{mn}+g_{mp})$. The differential input resistance is largely set by the parallel coupling of the NMOS and PMOS common-gate amplifiers:

$$\text{Re}\{Z_{IN}\} \approx \frac{1}{g_{mn} + g_{mp}}$$

Although transistors 208, 210, 232, and 234 of LNA 102 have been described as FET-type devices, they may alternatively be bipolar junction transistor (BJTs) devices. In this case, n-channel transistors 208 and 232 are n-junction or npn transistors, and p-channel transistors 210 and 234 are p-junction or pnp transistors. BJTs have terminals which are referred to as bases, emitters, and collectors, which are analogous to the gates, sources, and drains, respectively, of FETs. That is, a base of a BJT corresponds to a gate of a FET, an emitter of the BJT corresponds to a source of the FET, and a collector of the BJT corresponds to a drain of the FET. As apparent, BJT implementations of LNA 102 utilize a common-emitter and common-base configuration to achieve the same advantages of the FET topology which employs the common-source and common-gate configurations. The term "n-type" is used herein to refer to either n-channel or n-junction devices, and the term "p-type" is used herein to refer to either p-channel or p-junction devices. Further, the term "gate" is used herein to refer to either a gate of a FET or a base of a BJT; the term "source" is used herein to refer to either a source of the FET or an emitter of the BJT; and the term "drain" is used herein to refer to either a drain of the FET or a collector of the BJT.

Figure 3:
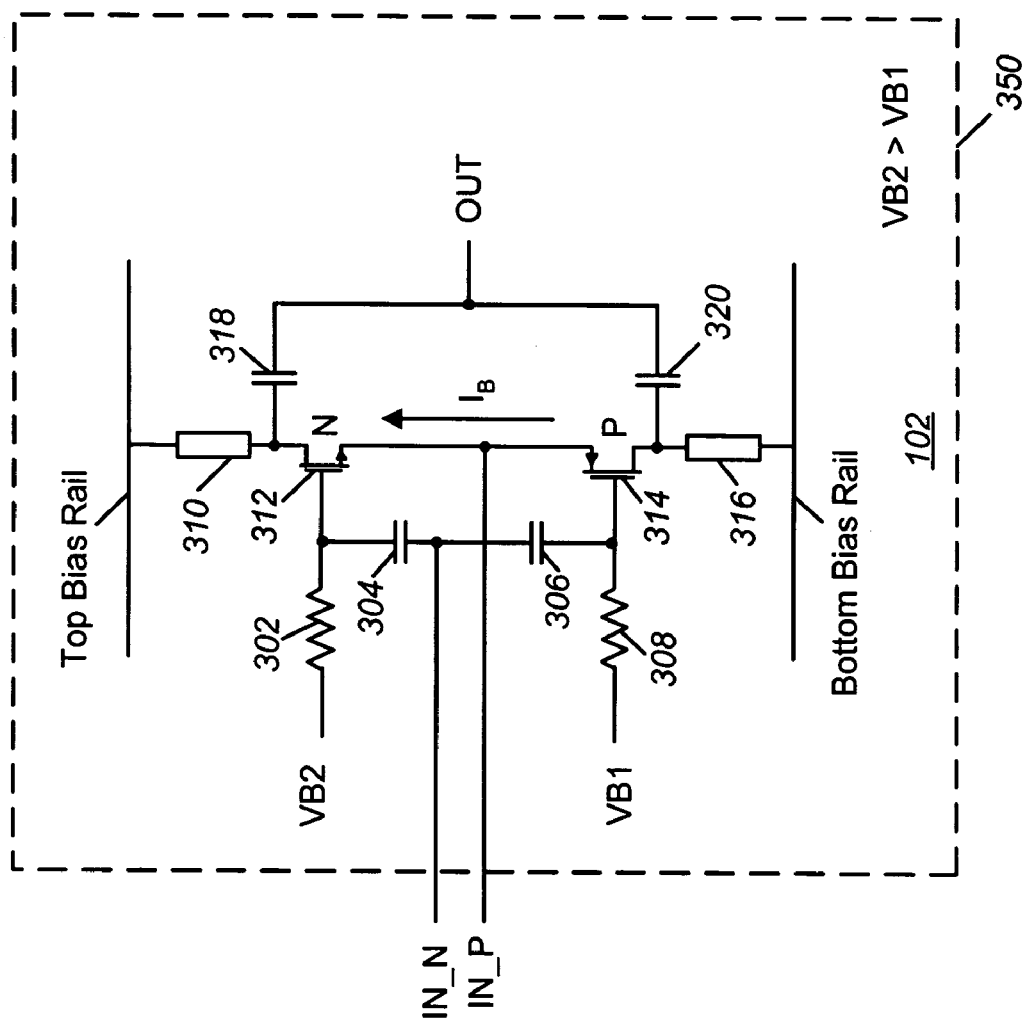
FIG. 3 is a schematic diagram of a low noise amplifier of the present application in a second embodiment, where the amplifier has a single-ended output.

FIG. 3 is a second embodiment of amplifying circuit 102 of the present application which is embodied within an IC 350. Amplifying circuit 102 of FIG. 3 provides an input which is adapted to receive a differential signal, but an output that is single-ended. Otherwise, the amplifying circuit of FIG. 3 is similarly structured and functions as a half portion of the amplifying circuit of FIG. 2.

Amplifying circuit 102 of FIG. 3 includes an n-channel transistor 312, a p-channel transistor 314, capacitors 304, 306, 318, and 320, impedance circuits 310 and 316, and resistors 302 and 308 (optional). A differential input is represented by and at IN_N and IN_P nodes, whereas a single-ended output is represented by and at an OUT node. The IN_N node is provided at first ends of capacitors 304 and 306, which have second ends coupled to the gates of transistors 312 and 314, respectively. The IN_P node is provided at sources of transistors 312 and 314. A drain of n-channel transistor 312 is coupled to a first bias rail voltage through an impedance circuit 310. Similarly, a drain of p-channel transistor 314 is coupled to a second bias rail voltage through an impedance circuit 316. A first end of capacitor 318 is coupled to the drain of n-channel transistor 312, whereas a first end of capacitor 320 is coupled to the drain of p-channel transistor 314. Second ends of capacitors 318 and 320 are coupled together to form the OUT node. The gate of p-channel transistor 314 is coupled to a bias voltage VB1 through a resistor 308, whereas the gate of n-channel transistor 312 is coupled to a bias voltage VB2 through resistor 302 (where VB2>VB1). Impedance circuits 310 and 316 may be referred to as "loads" and be implemented using any suitable components. Preferably, amplifying circuit 102 of FIG. 3 is devoid of any inductors where each impedance circuit 310 and 316 is implemented simply as a resistor. In this case, only a relatively small silicon area is needed for the amplifying circuit within the IC. Alternatively, the impedance circuits 310 and 316 may be implemented as inductors, capacitors, resistors, transformers, or any combination thereof. As with that shown and described in relation to FIG. 2, the circuit configuration of FIG. 3 having transistors 312 and 314, impedance circuits 310 and 316 with the capacitors 304 and 306 form a hybrid common-gate and common-source amplifying unit with current reuse.

Impedance devices 310 and 316 may be referred to as "loads" and be implemented using any suitable components. Preferably, amplifying circuit 102 is devoid of any inductors where each impedance circuit 310 and 316 is implemented simply as a resistor. In this case, only a relatively small silicon area is needed for amplifying circuit 102 within the IC. Alternatively, the impedance circuits 310 and 316 may be implemented as inductors, capacitors, resistors, transformers, or any combination thereof.

Together, the coupling of transistors 312 and 314, impedance circuits 310 and 316 with capacitors 304 and 306 form a differential hybrid common-gate and common-source amplifying unit with current reuse. The circuit configuration of n-channel transistor 312 and impedance circuit 310 serves as both an NMOS common-gate amplifier to the input signal IN_P and as an NMOS common-source amplifier to the input signal IN_N. The circuit configuration of p-channel transistor 314 and impedance circuit 316 serves as both a PMOS common-gate amplifier to the input signal IN_P and as a PMOS common-source amplifier to the input signal IN_N.

Although transistors 312 and 314 of FIG. 3 have been described as FET-type devices, they may alternatively be bipolar junction transistor (BJTs) devices. In this case, n-channel transistor 312 is an n-junction or npn transistor, and p-channel transistor 314 is a p-junction or pnp transistor. BJTs have terminals which are referred to as bases, emitters, and collectors, which are analogous to the gates, sources, and drains, respectively, of FETs. That is, a base of a BJT corresponds to a gate of a FET, an emitter of the BJT corresponds to a source of the FET, and a collector of the BJT corresponds to a drain of the FET. As apparent, BJT implementations of amplifier 102 of FIG. 3 utilize a common-emitter and common-base configuration to achieve the same advantages of the FET topology which employs the common-source and common-gate configurations. Again, the term "n-type" is used herein to refer to either n-channel or n-junction devices, and the term "p-type" is used herein to refer to either p-channel or p-junction devices. Further, the term "gate" is used herein to refer to either a gate of a FET or a base of a BJT; the term "source" is used herein to refer to either a source of the FET or an emitter of the BJT; and the term "drain" is used herein to refer to either a drain of the FET or a collector of the BJT.

Thus, as described herein, an amplifying circuit of the present application provides high performance, impedance controllability, robustness, and low power. The amplifying circuit achieves high performance by combining the functional advantages of FETs in common-source and common-gate configurations, and employs bias current reuse for power optimization. A differential signal arrangement, together with a stacking scheme of the active devices, enable each of the active devices to function as a common-source, common-gate hybrid amplifier. The amplifying circuit also has an improved noise performance. Simple signal connections between the components allow the bias current to be shared by the active devices. The amplifying circuit is robust with respect to implementation and needs only a small silicon area due to its low complexity.

In one illustrative embodiment of the present application, an amplifying circuit of an IC includes a first n-type transistor which is "stacked" on top of a first p-type transistor. The n-type transistor has a source, a gate coupled to a first bias voltage, and a drain coupled to a first supply rail voltage through a first impedance circuit. The p-type transistor has a source coupled to the source of the n-type transistor, a gate coupled to a second bias voltage, and a drain coupled to a second supply rail voltage through a second impedance circuit. A first differential input is coupled to the gate of the n-type transistor through a first capacitor and to the gate of the p-type transistor through a second capacitor. A second differential input is coupled to the sources of the n-type and the p-type transistors. A third capacitor has a first end coupled to the drain of the n-type transistor, and a fourth capacitor has a first end coupled to the drain of the p-type transistor and a second end coupled to a second end of the third capacitor. An output of the amplifier circuit is provided at the second ends of the third and the fourth capacitors. The n-type transistor and the first impedance circuit serve as a common-source amplifier for a signal at the first differential input and as a common-gate amplifier for the signal at the second differential input. Similarly, the p-type transistor and the second impedance circuit serve as a common-source amplifier for the signal at the first differential input and as a common-gate amplifier for the signal at the second differential input.

In another illustrative embodiment of the present application, a differential amplifier of the IC includes a first n-type transistor which is "stacked" on top of a first p-type transistor and a second n-type transistor which is "stacked" on top of a second p-type transistor. The first n-type transistor has a source, a gate coupled to a first bias voltage, and a drain coupled to a first supply rail voltage through a first impedance circuit. The first p-type transistor has a source coupled to the source of the first n-type transistor, a gate coupled to a second bias voltage, and a drain coupled to a second supply rail voltage through a second impedance circuit. A first differential input is coupled to the gate of the first n-type transistor through a first capacitor and to the gate of the first p-type transistor through a second capacitor. A second differential input is coupled to the sources of the first n-type and the first p-type transistors. A third capacitor has a first end coupled to the drain of the first n-type transistor, and a fourth capacitor has a first end coupled to the drain of the first p-type transistor and a second end coupled to a second end of the third capacitor. The second n-type transistor has a source, a gate coupled to the first bias voltage, and a drain coupled to the first supply rail voltage through a third impedance circuit. The second p-type transistor has a source coupled to the source of the second n-type transistor, a gate coupled to the second bias voltage, and a drain coupled to the second supply rail voltage through a fourth impedance circuit. The first differential input is coupled to the sources of the second n-type and the second p-type transistors. The second differential input is coupled to the gate of the second n-type transistor through a fifth capacitor and to the gate of the second p-type transistor through a sixth capacitor. A seventh capacitor has a first end coupled to the drain of the second n-type transistor, and an eighth capacitor having a first end coupled to the drain of the second p-type transistor and a second end coupled to a second end of the seventh capacitor. A first differential output is provided at the second ends of the third and the fourth capacitors, and a second differential output is provided at the second ends of the seventh and the eighth capacitors.

Although the embodiments of the present application are exemplified using MOSFET technology, alternate embodiments can be implemented using bipolar junction transistor (BJT) or other suitable transistor technology, in an integrated circuit or discrete circuit configuration. Also, persons ordinarily skilled in the art will appreciate that the impedance circuit loads (type and value) may be optimized to maximize circuit performance.

What is claimed is:
1. An amplifier circuit, comprising:
  an n-type transistor having:
    a source;
    a gate coupled to a first bias voltage;
    a drain coupled to a first supply rail voltage through a first impedance circuit;
  a p-type transistor having:
    a source coupled to the source of the n-type transistor;
    a gate coupled to a second bias voltage;
    a drain coupled to a second supply rail voltage through a second impedance circuit;
  a first differential input coupled to the gate of the n-type transistor through a first capacitor and to the gate of the p-type transistor through a second capacitor;
  a second differential input coupled to the sources of the n-type and the p-type transistors;
  a third capacitor having a first end coupled to the drain of the n-type transistor;
  a fourth capacitor having a first end coupled to the drain of the p-type transistor and a second end coupled to a second end of the third capacitor; and
  an output of the amplifier circuit being provided at the second ends of the third and the fourth capacitors.

2. The amplifier circuit of claim 1, further comprising:
  wherein the n-type transistor and the first impedance circuit serve as a common-source amplifier for a received signal at the first differential input and as a common-gate amplifier for the received signal at the second differential input; and
  wherein the p-type transistor and the second impedance circuit serve as a common-source amplifier for the received signal at the first differential input and as a common-gate amplifier for the received signal at the second differential input.

3. The amplifier circuit of claim 1, wherein the n-type transistor comprises an n-channel metal oxide semiconductor (NMOS) transistor and the p-type transistor comprises a p-channel metal oxide semiconductor (PMOS) transistor.

4. The amplifier circuit of claim 1, wherein the gate of the n-type transistor is coupled to the first bias voltage through a first resistor and the gate of the p-type transistor is coupled to the second bias voltage through a second resistor.

5. The amplifier circuit of claim 1, wherein a received signal at the second differential input is 180° out-of-phase with the received signal at the first differential input.

6. The amplifier circuit of claim 1, wherein the first impedance circuit comprises a first resistor and the second impedance circuit comprises a second resistor.

7. The amplifier circuit of claim 1, wherein the first impedance circuit comprises a first inductor and the second impedance circuit comprises a second inductor.

8. The amplifier circuit of claim 1, wherein the amplifier circuit is used as a low noise amplifier (LNA).

9. The amplifier circuit of claim 1, wherein the amplifier circuit is embodied in an integrated circuit (IC) with the first and the second differential inputs externally exposed on the IC.

10. The amplifier circuit of claim 1, wherein the n-type transistor comprises an npn bipolar junction transistor (BJT) and the p-type transistor comprises a pnp BJT.

11. The amplifier circuit of claim 1, wherein the amplifier circuit is devoid of any inductors.

12. The amplifier circuit of claim 1, wherein the n-type transistor comprises a first n-type transistor, the p-type transistor comprises a first p-type transistor, and the output comprises a first differential output, the amplifier circuit further comprising:
  a second n-type transistor having:
    a source;
    a gate coupled to the first bias voltage;
    a drain coupled to the first supply rail voltage through a third impedance circuit;
  a second p-type transistor having:
    a source coupled to the source of the second n-type transistor;
    a gate coupled to the second bias voltage;
    a drain coupled to the second supply rail voltage through a fourth impedance circuit;

the first differential input being coupled to the sources of the second n-type and the second p-type transistors;

the second differential input being coupled to the gate of the second n-type transistor through a fifth capacitor and to the gate of the second p-type transistor through a sixth capacitor;

a seventh capacitor having a first end coupled to the drain of the second n-type transistor;

an eighth capacitor having a first end coupled to the drain of the second p-type transistor and a second end coupled to a second end of the seventh capacitor; and a second differential output of the amplifier circuit being provided at the second ends of the seventh and the eighth capacitors.

13. A differential amplifier, comprising:
a first n-channel transistor having:
  a source;
  a gate coupled to a first bias voltage;
  a drain coupled to a first supply rail voltage through a first impedance circuit;
a first p-channel transistor having:
  a source coupled to the source of the first n-channel transistor;
  a gate coupled to a second bias voltage;
  a drain coupled to a second supply rail voltage through a second impedance circuit;
a first differential input coupled to the gate of the first n-channel transistor through a first capacitor and to the gate of the first p-channel transistor through a second capacitor;
a second differential input coupled to the sources of the first n-channel and the first p-channel transistors;
a third capacitor having a first end coupled to the drain of the first n-channel transistor;
a fourth capacitor having a first end coupled to the drain of the first p-channel transistor and a second end coupled to a second end of the third capacitor; and
a first differential output being provided at the second ends of the third and the fourth capacitors;
a second n-channel transistor having:
  a source;
  a gate coupled to the first bias voltage;
  a drain coupled to the first supply rail voltage through a third impedance circuit;
a second p-channel transistor having:
  a source coupled to the source of the second n-channel transistor;
  a gate coupled to the second bias voltage;
  a drain coupled to the second supply rail voltage through a fourth impedance circuit;
the first differential input being coupled to the sources of the second n-channel and the second p-channel transistors;
the second differential input being coupled to the gate of the second n-channel transistor through a fifth capacitor and to the gate of the second p-channel transistor through a sixth capacitor;
a seventh capacitor having a first end coupled to the drain of the second n-channel transistor;
an eighth capacitor having a first end coupled to the drain of the second p-channel transistor and a second end coupled to a second end of the seventh capacitor; and
a second differential output being provided at the second ends of the seventh and the eighth capacitors.

14. The differential amplifier of claim 13, further comprising:
wherein the n-channel transistor and the first impedance circuit serve as a common-source amplifier for a received signal at the first differential input and as a common-gate amplifier for the received signal at the second differential input; and
wherein the p-channel transistor and the second impedance circuit serve as a common-source amplifier for the received signal at the first differential input and as a common-gate amplifier for the received signal at the second differential input.

15. The differential amplifier of claim 13, wherein the gate of the n-channel transistor is coupled to the first bias voltage through a first resistor and the gate of the p-channel transistor is coupled to the second bias voltage through a second resistor.

16. The differential amplifier of claim 13, wherein a received signal at the second differential input is 180° out-of-phase with the received signal at the first differential input.

17. The differential amplifier of claim 13, wherein the first impedance circuit comprises a first resistor, the second impedance circuit comprises a second resistor, the third impedance circuit comprises a third resistor, and the fourth impedance circuit comprises a fourth resistor.

18. The differential amplifier of claim 13, wherein the first impedance circuit comprises a first inductor, the second impedance circuit comprises a second inductor, the third impedance circuit comprises a third inductor, and the fourth impedance circuit comprises a fourth inductor.

19. The differential amplifier of claim 13, wherein the first, the second, the third, and the fourth impedance circuits comprise one or more transformers.

20. The differential amplifier of claim 13, wherein the amplifier circuit is used as a low noise amplifier (LNA).

21. The differential amplifier of claim 13, wherein the amplifier circuit is embodied in an integrated circuit (IC) with the first and the second differential inputs externally exposed on the IC.

22. An integrated circuit (IC), comprising:
a first differential input externally exposed on the IC;
a second differential input externally exposed on the IC;
an n-type transistor having:
  a source;
  a gate coupled to a first bias voltage;
  a drain coupled to a first supply rail voltage through a first impedance circuit;
a p-type transistor having:
  a source coupled to the source of the n-type transistor;
  a gate coupled to a second bias voltage;
  a drain coupled to a second supply rail voltage through a second impedance circuit;
the first differential input being coupled to the gate of the n-type transistor through a first capacitor and to the gate of the p-type transistor through a second capacitor;
the second differential input being coupled to the sources of the n-type and the p-type transistors;
a third capacitor having a first end coupled to the drain of the n-type transistor;
a fourth capacitor having a first end coupled to the drain of the p-type transistor and a second end coupled to a second end of the third capacitor; and
an output being provided at the second ends of the third and the fourth capacitors.

23. The IC of claim 22, further comprising:
wherein the n-type transistor and the first impedance circuit serve as a common-source amplifier for a received signal at the first differential input and as a common-gate amplifier for the received signal at the second differential input; and wherein the p-type transistor and the second impedance circuit serve as a common-source amplifier for the received signal at the first differential input and as a common-gate amplifier for the received signal at the second differential input.

24. The IC of claim 22, wherein the gate of the n-type transistor is coupled to the first bias voltage through a first resistor and the gate of the p-type transistor is coupled to the second bias voltage through a second resistor.

25. The IC of claim 22, used as a low noise amplifier (LNA) of a radio receiver, which has a single-ended to differential converter coupled to an antenna.

26. The IC of claim 22, comprising an amplifier circuit which is devoid of any inductors.

27. The IC of claim 22, wherein the n-type transistor comprises a first n-type transistor, the p-type transistor comprises a second p-type transistor, and the output comprises a first differential output, the IC further comprising:
  a second n-type transistor having:
    a source;
    a gate coupled to the first bias voltage;
    a drain coupled to the first supply rail voltage through a third impedance circuit;
  a second p-type transistor having:
    a source coupled to the source of the second n-type transistor;
    a gate coupled to the second bias voltage;
    a drain coupled to the second supply rail voltage through a fourth impedance circuit;
  the first differential input being coupled to the sources of the second n-type and the second p-type transistors;
  the first second differential input being coupled to the gate of the second n-type transistor through a fifth capacitor and to the gate of the second p-type transistor through a sixth capacitor;
  a seventh capacitor having a first end coupled to the drain of the second n-type transistor;
  an eighth capacitor having a first end coupled to the drain of the second p-type transistor and a second end coupled to a second end of the seventh capacitor; and
  a second differential output being provided at the second ends of the seventh and the eighth capacitors.

* * * * *